United States Patent [19]

Lukaszek

[11] Patent Number: 5,594,328
[45] Date of Patent: Jan. 14, 1997

[54] PASSIVE PROBE EMPLOYING CLUSTER OF CHARGE MONITORS FOR DETERMINING SIMULTANEOUS CHARGING CHARACTERISTICS OF WAFER ENVIRONMENT INSIDE IC PROCESS EQUIPMENT

[76] Inventor: Wieslaw A. Lukaszek, 129 Marine Rd., Woodside, Calif. 94063

[21] Appl. No.: 389,699

[22] Filed: Feb. 14, 1995

[51] Int. Cl.⁶ .................................................. H01L 27/02
[52] U.S. Cl. ............................................... 324/72; 257/379
[58] Field of Search .............................. 324/72; 257/379, 257/317, 321

[56] References Cited

U.S. PATENT DOCUMENTS 5,315,145  5/1994  Lukaszek .......................... 257/379

OTHER PUBLICATIONS

Lukaszek et al., Characterization of Wafer Charging Mechanisms and Oxide Survival Prediction Methodology, Presentation at 1993 International Integrated Reliability Workshop, Lake Tahoe, California, Oct. 24–27, 1993, pp. 131–136.
Lukaszek et al., Characterization of Wafer Charging Mechanisms and Oxide Survival Prediction Methodology, Presentation at 1994 International Reliability Physics Symposium, San Jose, California, Apr. 12–14, 1994, pp. 334–338.

Primary Examiner—Kenneth A. Wieder
Assistant Examiner—Barry C. Bowser
Attorney, Agent, or Firm—Townsend and Townsend and Crew LLP; Henry K. Woodward

[57] ABSTRACT

The current density versus voltage characteristics of integrated circuit processing equipment such as a plasma etcher are determined using a passive probe including a semiconductor wafer in which one or more clusters of individual passive charge monitors are fabricated. Each monitor includes an EEPROM device having a control electrode and a floating electrode over a channel region connecting source and drain regions, a charge collecting electrode connected to the control electrode, and a current sensing resistor connecting the charge collection electrode to the substrate for developing a threshold varying voltage. By determining changes in device threshold voltage, a corresponding surface-substrate potential is determined which can be divided by the value of the current-sensing resistor to yield a current. The current can then be divided by the area of the charge collecting electrode to yield a value of the current density. A single charge flux monitor thus yields one point on the J-V characteristic curve of the monitored charging source.

24 Claims, 4 Drawing Sheets

PASSIVE PROBE EMPLOYING CLUSTER OF CHARGE MONITORS FOR DETERMINING SIMULTANEOUS CHARGING CHARACTERISTICS OF WAFER ENVIRONMENT INSIDE IC PROCESS EQUIPMENT

BACKGROUND OF THE INVENTION

This invention relates generally to semiconductor product fabrication, and more particularly the invention relates to devices and methods for monitoring deleterious effects on semiconductor wafers due to charge induced damage during fabrication of integrated circuits and other semiconductor devices.

It is known that semiconductor processes such as ion implantation, plasma etching, and other charged beam processing may cause damage to semiconductor wafers and the devices and circuits fabricated therein. To assess the damage-generating tendency of such processes, and to determine safe integrated circuit layout guidelines, the semiconductor industry has used polysilicon capacitors with varying gate oxide-field oxide ratios, edge-area ratios, and the like to statistically assess the manner and extent to which these parameters influence the degree of damage, and to develop or select more benign process options. However, due to the indirect nature of this monitoring procedure which relies on compiling frequency of oxide breakdown statistics, the results have frequently been inconclusive and confusing.

It is also known that damage to MOS transistors, capacitors, and other IC device structures is caused by the passage of current through the insulating layers, generally oxides or their derivatives, incorporated in the make-up of such structures. In particular, the quality and reliability of gate dielectrics employed in MOS transistors is generally assessed by the magnitude of the charge per unit area, Qbd, which oxides withstand before breakdown. Degradation of other device parameters, such as MOS transistor threshold voltage, transconductance, sub-threshold leakage, and junction leakage is also directly related to the amount of charge passed through the gate oxide.

To assess the ability of a charged particle process medium to inflict damage to IC device structures, it is, therefore, essential to know the magnitude of the charge fluxes collected by electrodes, such as gate electrodes and interconnect metalization connected to gate electrodes which are exposed to charge fluxes during integrated circuit processing. Moreover, since the passage of charge through oxides requires sufficiently high potentials to be developed across the oxides, the prediction of damage in IC structures during integrated circuit processing requires that the charge-density vs. voltage, J-V characteristics (where V=Vsurface−Vsubstrate) of the various media employed in wafer processing be accurately determined.

Although a variety of probes, generally known as Langmuir probes, have been developed and are used to characterize the J-V characteristics of charged particle media, an example of which is shown in FIG. 1, they suffer from the limitation that they do not measure the J-V characteristic at the wafer surface, where a variety of mechanisms, such as emission of secondary electrons or charged and neutral species from photoresist covering a portion of the wafer surface during these processes, change the local plasma density and the local plasma J-V characteristics. Moreover, such integrated circuit processes often exhibit substantial and deleterious non-uniformities over the wafer surface, which are difficult and very time consuming to characterize using a single probe. Consequently, to characterize these effects and their impact on the local plasma J-V characteristics, it is essential that the J-V probes be incorporated into the wafer surface, and frequently replicated over the surface of the wafer.

Practical application of conventional wafer surface probes, which require power and signal connections, is also precluded in integrated circuit manufacturing by the difficulty of supplying power and retrieving signals in an electrically-hostile plasma environment, compounded by rotating wafer supports and wafer transports employing complex robotic wafer handling mechanisms.

Lukaszek U.S. Pat. No. 5,315,145 discloses a charge monitoring device which can be fabricated in a semiconductor wafer for monitoring either positive or negative surface charge by shunting undesired charge on a charge collecting electrode to ground. The selected charge on the charge collecting electrode alters the threshold voltage of the EEPROM device.

The present invention is directed to a practical tool for characterizing the J-V characteristics of wafer charging media in such environments, including a self-contained, discrete, passive plasma wafer probe, which requires no power or connections to the wafer.

SUMMARY OF THE INVENTION

In accordance with the invention, a passive wafer probe is provided having a cluster of individual charge monitors, each charge monitor including a voltage memory device such as an EEPROM transistor fabricated in the surface of a semiconductor wafer with a charge collection electrode connected to the gate electrode of the transistor, similar to the device in U.S. Pat. No. 5,315,145. Means can be provided for limiting charge collecting to one polarity. Additionally, a current-sensing element such as a resistor is provided between the charge collection electrode and the substrate to develop a voltage across the resistor which changes the threshold voltage of the EEPROM transistor. The resultant threshold voltage can be transformed to a corresponding surface-substrate potential and to a current density for plotting J-V characteristics.

The plurality of individual charge monitors can be implemented with different values of current sensing resistors, thus yielding a multiplicity of points on the J-V characteristic curve for the charging source. By employing a plurality of clusters of charge monitors, with each cluster having monitors with different values of current sensing resistors, across a wafer surface, the J-V characteristics across the wafer are determined simultaneously.

The invention and objects and features thereof will be more readily apparent from the following description and appended claims when taken with the drawings.

DETAILED DESCRIPTION OF ILLUSTRATIVE EMBODIMENTS

Figure 1:
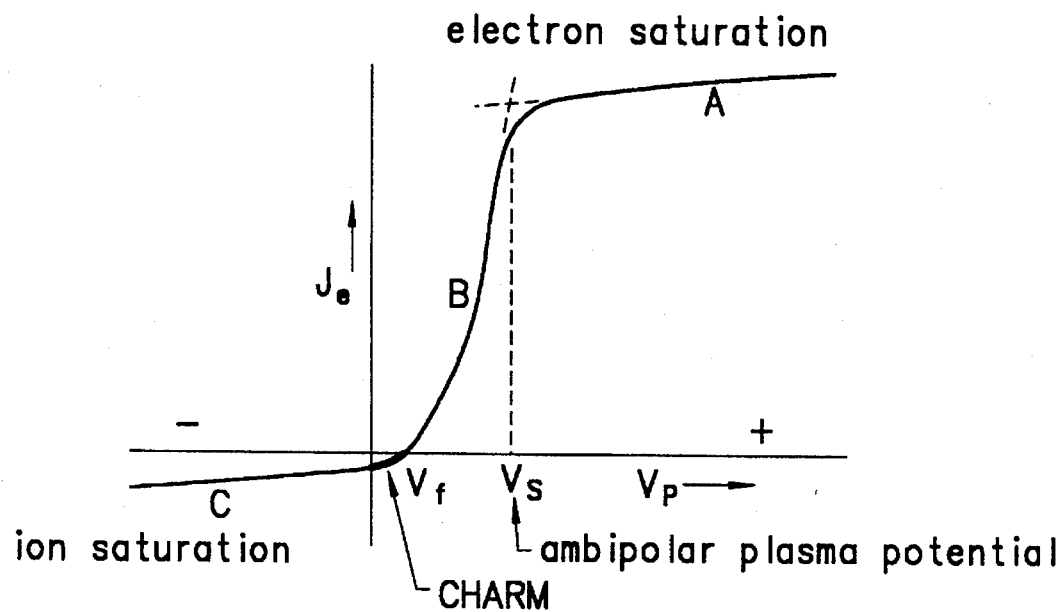
FIG. 1 is a curve illustrating the J-V characteristics of a charged particle media.
Figure 2:
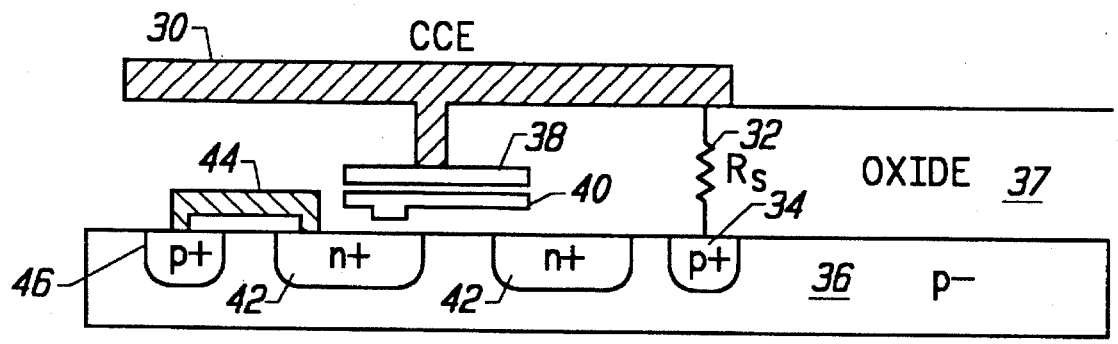
FIG. 2 is a schematic section view of a charge monitor as used in one embodiment of the invention.

To implement a passive, wafer-based plasma probe requiring no power and having good spatial resolution over the surface of the wafer in accordance with the invention, the charge flux monitor shown in FIG. 2 is replicated on the wafer surface a large number of times, in clusters (die) each of which contains a large number of such charge flux monitors, each of which having a different value of current-sensing resistor, Rs.

Figure 3:
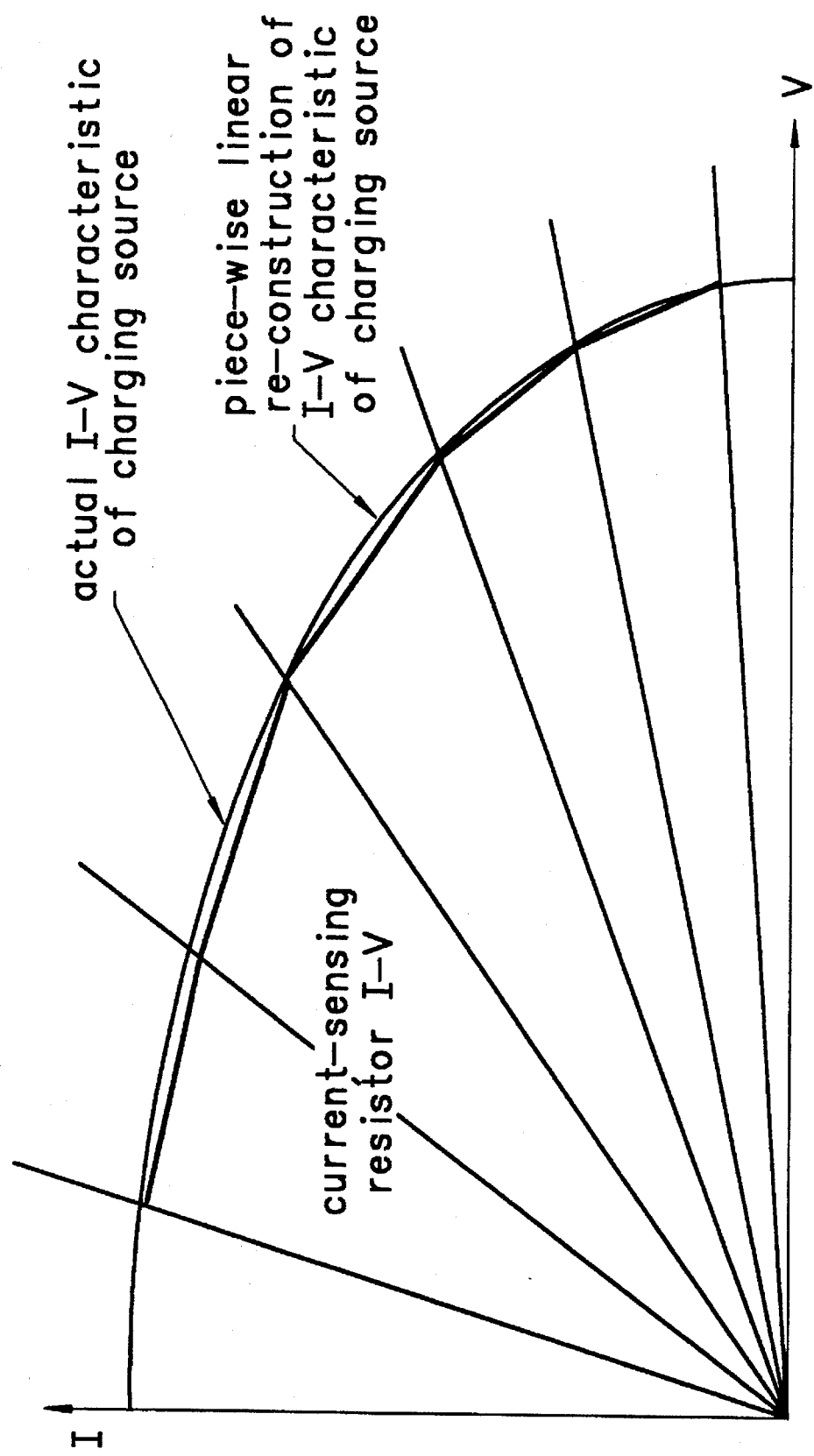
FIG. 3 is a curve illustrating the construction of a J-V curve in accordance with the invention.

The structure of FIG. 2 is similar to the structure of FIG. 3A of U.S. Pat. No. 5,315,145 except FIG. 2 is a bipolar current sensor device while the FIG. 3A device is unipolar potential sensor. The plasma charge monitor of FIG. 2 comprises an EEPROM memory device in which a resistor, Rs, is connected between the charge collection electrode and the semiconductor substrate in which the device is fabricated. More particularly, the charge collection electrode is connected through current sensing resistor 32 through the P+ contact 34 to the P– substrate 36. The resistive path can be provided by doped polysilicon deposited in a hole etched through the silicon oxide 37, for example. The charge collection electrode 30 is connected to the control electrode 38 of the EEPROM. The floating gate 40 is provided between the control electrode 38 and the source and drain regions 42 and over the channel region of the EEPROM. In this embodiment, a tunnel oxide is provided between a projection of the floating gate 40 and the source region 42. Ohmic connection 44 and P+ region 46 provide an ohmic connection between the n+ source region 42 and the P– substrate 36. The monitor of FIG. 2 is sensitive to positive and negative charges.

Each charge flux monitor works as follows. Prior to use, the threshold voltage of the EEPROM transistor is set to a saturated positive or negative value, i.e., the maximum threshold voltage that the EEPROM can support. During use, the charge collected by the charge collection electrode flows through the current-sensing resistor, Rs, to the wafer substrate, thereby developing a voltage across the resistor, which changes the threshold voltage of the EEPROM transistor. From the knowledge of the final threshold voltage state and the programming characteristics of the EEPROM transistor, as described in U.S. Pat. No. 5,315,145, the resultant threshold voltage is transformed to a corresponding surface-substrate potential. This potential, divided by the value of the current-sensing resistor, yields a value of current, which, divided by the area of the charge collecting electrode, yields a value of current density at that value of surface-substrate potential. A single charge flux monitor thus yields a single point on the J-V characteristic curve of the charging source being monitored.

A multiplicity of such charge flux monitors, implemented with different values of current-sensing resistors, yields a multiplicity of points on the J-V characteristic curve of the charging source. This multiplicity of J-V values allows a piece wise linear construction of the J-V characteristics of the charging source. These concepts are graphically illustrated in FIG. 3, which shows the multiplicity of intersections of the resistor I-V characteristics with the I-V characteristics of the charging source, and the piece wise linear construction of the I-V characteristics of the charging source.

Although the passive plasma probe described above is adequate for reconstructing the J-V characteristics of a steady state plasma, it is not sufficient for obtaining both positive and negative J-V characteristics of a transient charging source, such as a high-current ion implanter, in which devices on the surface of the wafer being implanted are subjected to alternating positive and negative charging sources as the wafer passes in and out of the ion beam. Because the EEPROM transistor, which acts as the sensing and memory element of the charge flux monitor, is a fast-responding device, under the transient conditions existing in a high current ion implanter it would record only the last (negative) charging transient.

Figure 4:
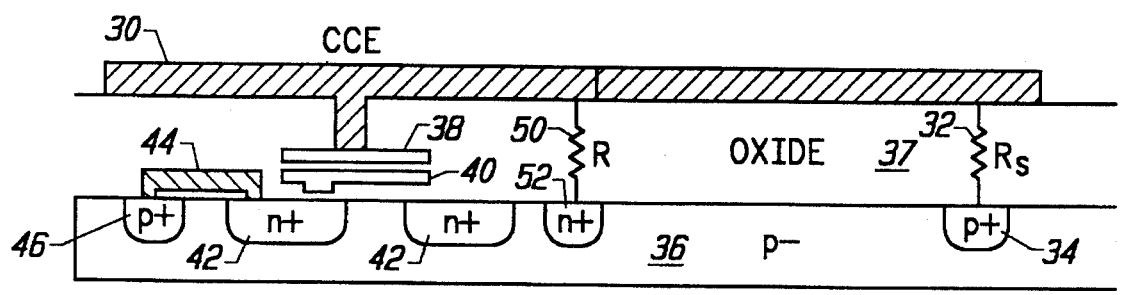
FIGS. 4 and 5 are section views of unipolar charge monitors as used in embodiments of the invention.
Figure 5:
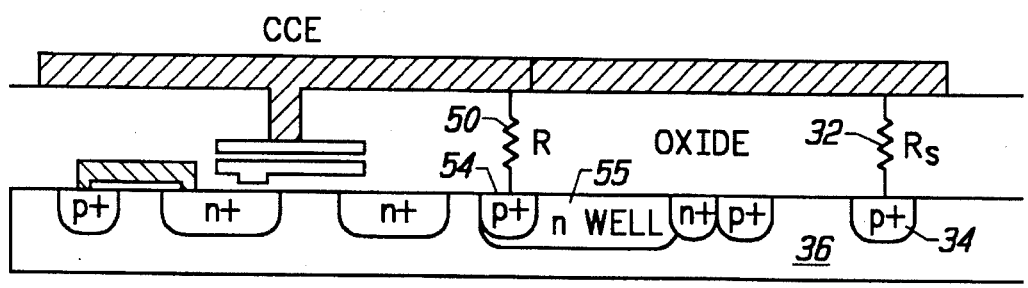

In order to implement passive plasma probes in accordance with the invention and capable of recording both negative and positive J-V characteristics of any charging source, it is essential to employ charge flux monitors capable of recording only positive or only negative charging, by extending the capabilities of the charge flux monitor shown in FIG. 2, with the addition of diodes or diodes in series with low resistance resistors 50 connected, in parallel with the current sensing resistor 32, as shown in FIGS. 4 and 5. Like elements in FIGS. 2, 4, and 5 have the same numerals. The configuration shown in FIG. 4 implements a charge flux monitor which senses strictly positive charging, since negative charge is shunted to the substrate by the n+p diode of doped regions 52, 36, while the configuration shown in FIG. 5 implements a charge flux monitor which senses strictly negative charging, since positive charge is shunted to the substrate by the p+n diode of regions 54, 55.

Once the J-V characteristic of a charging medium is determined, its intersection with the gate oxide J-V characteristic (also known as the Fowler-Nordheim characteristic) determines the current density, Jox, which the charging source can force into the dielectric. Given the process time, tp, the size of the charge collection electrode (also known as "antenna"), Af, and the size of the gate oxide region, Ag, the charge per unit area forced into the gate oxide, Qox, is given by $$Qox=Jox*tp*Af/Ag$$

This quantity may be compared to the breakdown charge of the oxide, Qbd, to determine the extent of oxide lifetime reduction. If Qox>Qbd, the gate oxide will be destroyed by the process medium. If Qox<<Qbd, the medium will create little damage to the oxide. Finally, if the process J-V characteristic indicates that J->0 for voltages smaller than the oxide breakdown voltage, damage to oxide is not possible.

Figure 6:
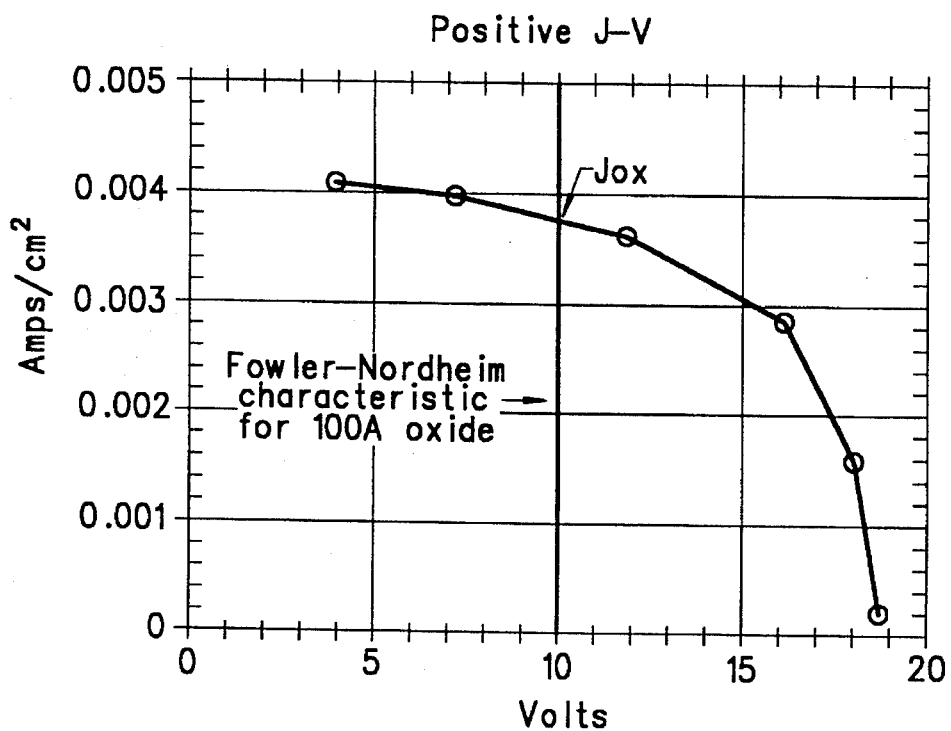
FIGS. 6 and 7 are typical positive and negative J-V characteristic curves, respectively, along with Fowler-Nordheim oxide conduction characteristics for a gate oxide.

A typical positive J-V characteristic obtained in the course of a high current, Arsenic source/drain implant with the passive plasma probe disclosed herein is shown in FIG. 6 along with the Fowler-Nordheim oxide conduction characteristic for 100 Angstrom gate oxide, and the intersection of the two curves which yields the value Jox of positive current density which will be imposed on the charge collection electrode of a given IC device structure in the course of processing an IC product wafer during this source/drain implant.

Figure 7:
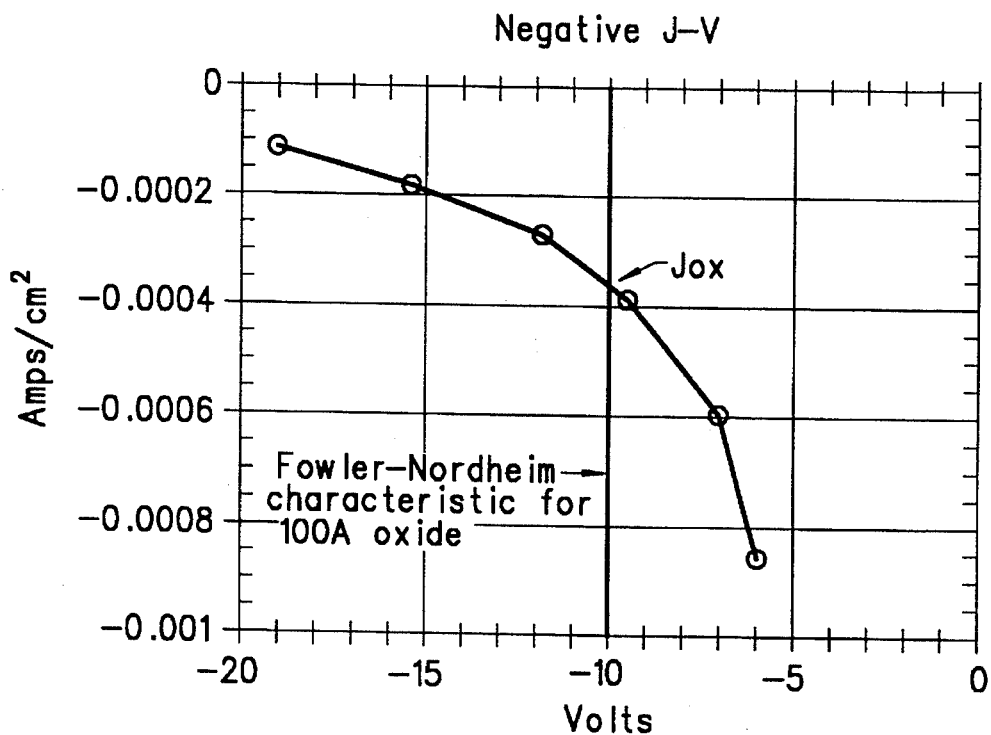

A typical negative J-V characteristic obtained under different implanter settings in the course of a high current, Arsenic source/drain implant with the passive plasma probe disclosed herein is shown in FIG. 7, along with the Fowler-Nordheim oxide conduction characteristic for 100 Angstrom gate oxide, and the intersection of the two curves which yields the value of Jox of negative current density which will be imposed on the charge collection electrode of a given IC device structure in the course of processing an IC product wafer during this source/drain implant.

There have been described a method of determining charging characteristics of a wafer environment inside of integrated circuit process equipment and a method for predicting integrated circuit device damage during manufacture. The methods employ a cluster of wafer-based charge monitors having different current-sensing resistors for providing points on a J-V characteristic curve of the monitored source. While the invention has been described with reference to specific embodiments, the description is illustrative of the invention and is not to be construed as limiting the invention. For example, the EEPROM transistor can be replaced by other voltage memory devices such as for example an MNOS transistor. Further, the current sensing resistor can be replaced by other current sensing elements which will exhibit other desired I-V characteristics, for example, a diode or other device having non-linear characteristics. Thus, various modifications and applications may occur to those skilled in the art without departing from the true spirit and scope of the invention as defined by the appended claims.

What is claimed is:

1. A method of determining charging characteristics of a wafer environment inside of integrated circuit process equipment, said method comprising the steps of
   a) providing a wafer based probe including a cluster of individual charge each monitors in a wafer with each monitor including a voltage memory device, a charge collection electrode and a current-sensing element connecting said charge collection electrode to said wafer, the characteristics of said current sensing element varying among said individual charge monitors,
   b) placing said wafer based probe inside said integrated circuit environment, and
   c) determining resultant voltages across said current-sensing elements from said voltage memory devices as a measure of said charging characteristics.

2. The method as defined by claim 1 wherein step c) further includes, obtaining a corresponding current from current-voltage characteristics of the current sensing elements, and dividing the current by area of the charge collecting electrode to obtain a current density for the surface-substrate potential.

3. The method as defined by claim 2 wherein step c) further includes transforming resultant threshold voltage to a corresponding surface-substrate potential, obtaining a corresponding current from current-voltage characteristics of the current sensing element, and dividing the current by area of the charge collecting electrode to obtain a current density for the surface-substrate potential.

4. A method of determining charging characteristics of a wafer environment inside of integrated circuit process equipment, said method comprising the steps of
   a) providing a wafer based probe including a cluster of individual charge monitors in a wafer with each monitor including an EEPROM device, a charge collection electrode and a current-sensing resistor connecting said charge collection electrode to said wafer, the resistance of said current sensing resistor varying among said individual charge monitors,
   b) providing initial threshold voltages on the EEPROM devices,
   c) placing said wafer based probe inside said integrated circuit environment, and
   d) determining resultant threshold voltages of the EEPROM devices as a measure of said charging characteristics.

5. The method as defined by claim 4 wherein step d) further includes transforming resultant threshold voltage to a corresponding surface-substrate potential, obtaining a corresponding current from current-voltage characteristics of the current sensing element, and dividing the current by area of the charge collecting electrode to obtain a current density for the surface-substrate potential.

6. The method as defined by claim 5 and wherein step d) includes determining a single point on a J-V curve for each charge monitor.

7. The method as defined by claim 6 wherein said initial threshold voltages are saturated threshold voltages.

8. The method as defined by claim 7 wherein each monitor is unipolar.

9. The method as defined by claim 4 wherein said initial threshold voltages are saturated voltages.

10. The method as defined by claim 9 wherein each monitor is unipolar.

11. The method as defined by claim 10 wherein step a) includes providing a wafer based probe having a plurality of clusters of individual charge monitors across a surface of said wafer.

12. The method as defined by claim 4 wherein step a) includes providing a wafer based probe having a plurality of clusters of individual charge monitors across a surface of said wafer.

13. A passive probe for use in determining charging characteristics of a wafer environment inside of integrated circuit process equipment comprising: a semiconductor wafer having a major surface, and a cluster of individual charge monitors in said surface with each monitor including a voltage memory device, a charge collection electrode, and a current-sensing element connecting said charge collection electrode to said substrate, said current-sensing elements in said cluster having different current-voltage characteristics.

14. The probe as defined by claim 13 wherein said charge memory device comprises an EEPROM device.

15. The probe as defined by claim 13 wherein said charge memory device comprises an MNOS transistor.

16. The probe as defined by claim 13 wherein said current sensing element comprises a resistor.

17. The probe as defined by claim 13 wherein said current sensing element comprises a diode.

18. The probe as defined by claim 13 and further including a plurality of said clusters in said surface for providing a high spatial resolution over said surface.

19. A passive probe for use in determining charging characteristics of a wafer environment inside of integrated circuit process equipment comprising: a semiconductor wafer having a major surface, and a cluster of individual charge monitors in said surface with each monitor including an EEPROM device having a control electrode and a floating electrode over a channel region between spaced source and drain regions, a charge collection electrode connected to said control electrode, and a current-sensing resistor connecting said charge collection electrode to said substrate, said current-sensing resistors in said cluster having different resistance values.

20. The probe as defined by claim 19 and further including diode means connecting said charge collection electrode to said substrate for providing a low resistance path for charge of one polarity to said substrate, whereby each of said charge monitors is unipolar in collecting charge opposite to said one polarity.

21. The probe as defined by claim 20 and further including a plurality of said clusters in said surface for providing high spatial resolution over said surface.

22. The probe as defined by claim 21 wherein some of said charge monitors are unipolar in collecting positive charge, and other of said charge monitors are unipolar in collecting negative charge.

23. The probe as defined by claim 22 wherein said floating gate functions as a memory for storing a resultant threshold voltage.

24. The probe as defined by claim 19 wherein said floating gate functions as a memory for storing a resultant threshold voltage.

* * * * *